United States Patent [19]

Suzuki et al.

[11] 4,167,710

[45] Sep. 11, 1979

[54] PULSE WIDTH MODULATED SIGNAL AMPLIFIER WITH PROTECTIVE MEANS

[75] Inventors: Tadao Suzuki; Tadao Yoshida, both of Tokyo, Japan

[73] Assignee: Sony Corporation, Tokyo, Japan

[21] Appl. No.: 855,389

[22] Filed: Nov. 28, 1977

[30] Foreign Application Priority Data

Dec. 2, 1976 [JP] Japan .............................. 51-145112

[51] Int. Cl.² .............................................. H03F 3/04
[52] U.S. Cl. ....................................... 330/298; 330/10;
330/207 A; 330/207 P; 330/297; 330/251
[58] Field of Search ................. 330/10, 207 A, 207 P, 330/298, 251, 297

[56] References Cited

U.S. PATENT DOCUMENTS 3,976,955 8/1976 Hamada ............................ 330/207 P
4,006,428 2/1977 Meyer et al. ................. 330/207 P X

*Primary Examiner*—Lawrence J. Dahl
*Attorney, Agent, or Firm*—Lewis H. Eslinger; Alvin Sinderbrand

[57] ABSTRACT

A pulse width modulated signal amplifier comprises a DC power supply for rectifying an AC input voltage to produce a pair of DC voltages of opposite polarity, a pulse width modulated signal amplifying circuit supplied with a pulse width modulated signal to produce a demodulated signal through a low pass filter, and a detecting circuit responsive to an abnormal level of the DC voltages to produce a detecting signal when a smoothing condenser of the DC power supply is overcharged by a current flowing through the low pass filter in one direction. Such detecting signal is desirably employed to prevent the appearance of the output signal from the pulse width modulated amplifying circuit.

18 Claims, 9 Drawing Figures

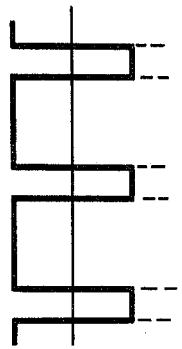 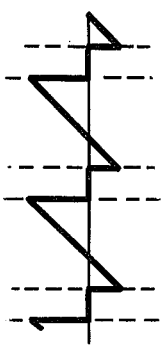 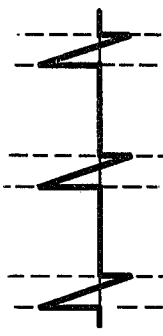 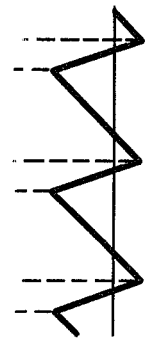
Fig-3A  Fig-3B  Fig-3C  Fig-3D
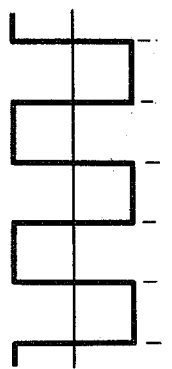 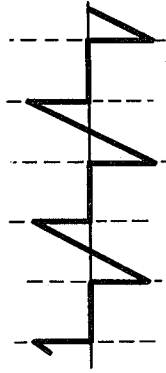 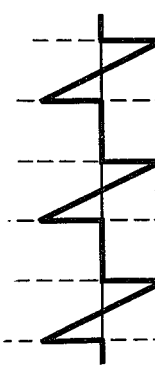 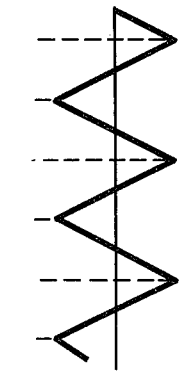
Fig-2A  Fig-2B  Fig-2C  Fig-2D

PULSE WIDTH MODULATED SIGNAL AMPLIFIER WITH PROTECTIVE MEANS

BACKGROUND OF THE INVENTION

1. Field of the Invention

This invention relates generally to a pulse width modulated signal amplifier, and more particularly is directed to a protecting circuit of a pulse width modulated signal amplifier having a rectifying circuit for rectifying an AC voltage to obtain a DC operating voltage for the amplifier.

Description of the Prior Art

In a prior art pulse width modulated signal amplifier, there is provided at its output side, a low pass filter including an inductance for demodulating an amplified pulse width modulated signal to an audio signal or the like. Normally, forward and backward (positive and negative) currents alternately flow through this low pass filter. However, when the frequency of the output signal is very low, for example, on the order of 20Hz, or when a load impedance is lowered due to short-circuiting of the load, a large current will flow, particularly in one direction, in the low pass filter. This current causes overcharging of a smoothing condenser of a rectifying circuit forming a DC power supply for the amplifier, and hence the level of the DC output voltage of the rectifying circuit rises unacceptably to destroy the smoothing condenser or to damage an amplifying switching element of the amplifier.

OBJECTS AND SUMMARY OF THE INVENTION

An object of this invention is to provide a pulse width modulated signal amplifier which is free of the above described defect.

Another object is to provide a pulse width modulated signal amplifier which can effectively prevent a smoothing condenser of the DC power supply from being destroyed in a no-load condition.

A further object of this invention is to provide a pulse width modulated signal amplifier, as aforesaid, which can effectively prevent damage to an amplifying switching element in the no-load condition.

Still another object is to provide a pulse width modulated signal amplifier, as aforesaid, in which a detecting signal is obtained when a DC power supply voltage exceeds a predetermined value.

An additional object of this invention is to provide a pulse width modulated signal amplifier, as aforesaid, in which when a DC power supply voltage exceeds a predetermined value, an output signal is not supplied to a signal output terminal of the amplifier.

A still further object of this invention is to provide a pulse width modulated signal amplifier in which the protecting circuit functioning at a time when a DC power supply voltage exceeds a predetermined value to prevent damage to a smoothing condenser or to an amplifying switching element, also serves as a muting circuit upon turning-on of the power supply.

According to an aspect of this invention, a pulse width modulated signal amplifier comprises a DC power supply, a pulse width modulated signal amplifying circuit having amplifying switching means operated by DC voltages from the DC power supply and driven in response to a pulse width modulated signal for normally providing a demodulated signal through a low pass filter to a signal output terminal, and a detecting circuit for detecting the level of the DC voltages from the power supply so as to provide a detecting signal when either of the DC voltages exceeds a predetermined value. The occurrence of such detecting signal is desirably employed to cause a protective circuit to prevent the application of the demodulated output to the signal output terminal, whereby to avoid damage to smoothing condensers associated with the DC power supply or to the amplifying switching means, for example, as when a DC voltage from the DC power supply is excessively increased due to a very low frequency of the demodulated output signal or due to a lowered load impedance, as by short-circuiting of the load connected to the signal output terminal.

The above, and other objects, features and advantages of the present invention, will be apparent from the following description which is to be read in conjunction with the accompanying drawings.

BRIEF DESCRIPTION OF THE DRAWINGS

FIGS. 2A to 2D and FIGS. 3A to 3D are respective waveforms to which reference will be made in explaining operation of the pulse width modulated signal amplifier according to this invention illustrated on FIG. 1.

DESCRIPTION OF A PREFERRED EMBDDIMENT

Figure 1:
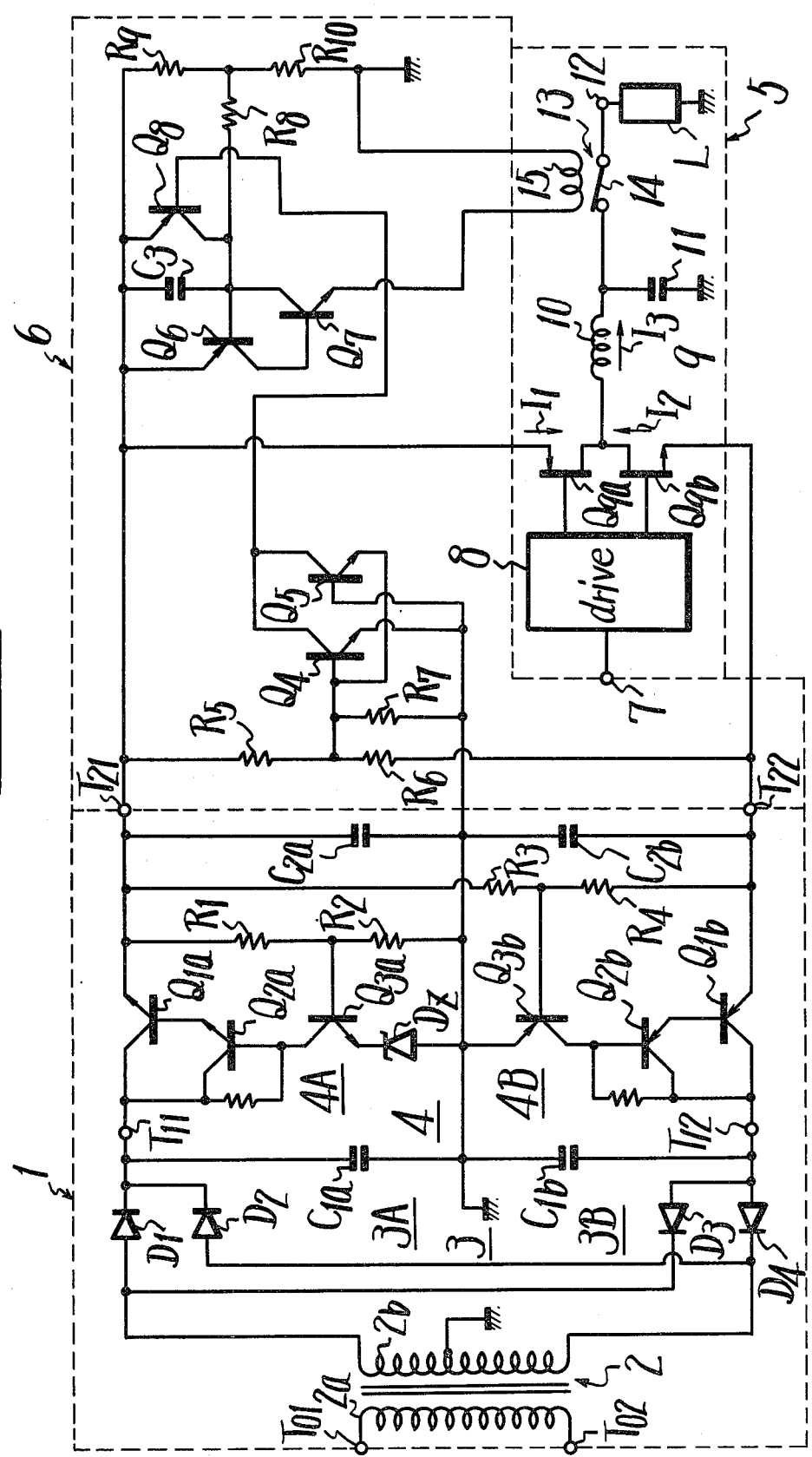
FIG. 1 is a circuit diagram showing an embodiment of a pulse width modulated signal amplifier according to this invention.

Referring to the drawings in detail and initially to FIG. 1 thereof, it will be seen that a pulse width modulated signal amplifier according to this invention is there illustrated to generally comprise a DC power supply 1 including a power transformer 2, rectifing means 3 and a constant voltage circuit 4, an amplifying circuit 5, and a detecting circuit 6.

More particularly, in the DC power supply 1 of the illustrated embodiment, power transformer 2 is shown to have a primary winding 2a and a secondary winding 2b. A commercial AC voltage of 100 volts is applied to primary winding 2a between its input terminals $T_{01}$ and $T_{02}$. The secondary winding 2b is grounded at its midpoint and connected at its opposite ends to rectifying means 3 consisting of a pair of rectifying circuits 3A and 3B from which are respectively derived positive and negative DC voltages. The rectifying circuit 3A is formed of rectifying diodes $D_1$ and $D_2$ and a smoothing condenser $C_{1a}$ so that a positive DC voltage can be obtained at an output terminal $T_{11}$. Similarly, rectifying circuit 3B is formed of rectifying diodes $D_3$ and $D_4$ and a smoothing condenser $C_{1b}$ so that a negative DC voltage can be obtained at an output terminal $T_{12}$. The junction between smoothing condensers $C_{1a}$ and $C_{1b}$ is grounded.

The rectifying means 3 is connected at its output side with constant voltage circuit 4 which is shown to consist of a pair of voltage regulating circuits 4A and 4B. The voltage regulating circuit 4A is formed of a pair of voltage regulating NPN-type transistors $Q_{1a}$ and $Q_{2a}$ having a Darlington configuration, an NPN-type transistor $Q_{3a}$ for comparison, a Zener diode $D_z$ serving as a reference voltage element, and a series circuit of resistors $R_1$ and $R_2$ serving as a load voltage detecting circuit.

The collector of transistor $Q_{1a}$ is connected to the terminal $T_{11}$ and the emitter thereof is connected to a DC output terminal $T_{21}$. The base of transistor $Q_{2a}$ is connected to the collector of transistor $Q_{3a}$ and the emitter of transistor $Q_{3a}$ is connected to the cathode of Zener diode $D_z$ which has its anode grounded. The series circuit of resistors $R_1$ and $R_2$ is connected between DC output terminal $T_{21}$ and the ground and the junction between resistors $R_1$ and $R_2$ is connected to the base of transistor $Q_{3a}$. Between the terminal $T_{21}$ and the ground is further connected a smoothing condenser $C_{2a}$ so that a constant positive DC voltage can be obtained at terminal $T_{21}$.

The voltage regulating circuit 4B is formed of a pair of voltage regulating PNP-type transistors $Q_{1b}$ and $Q_{2b}$ having a Darlington configuration, a PNP-type transistor $Q_{3b}$ for comparison, and a series circuit of load voltage detecting resistors $R_3$ and $R_4$. The collector of transistor $Q_{1b}$ is connected to terminal $T_{12}$ and the emitter thereof is connected to a DC output terminal $T_{22}$. The base of transistor $Q_{2b}$ is connected to the collector of transistor $Q_{3b}$ and the emitter of transistor $Q_{3b}$ is grounded. The series circuit of resistor $R_3$ and $R_4$ is connected between terminals $T_{21}$ and $T_{22}$, and the junction between resistors $R_3$ and $R_4$ is connected to the base of transistor $Q_{3b}$. Between the terminal $T_{22}$ and the ground is connected a smoothing condenser $C_{2b}$ so that a constant negative DC voltages can be obtained at terminal $T_{22}$.

In the amplifying circuit 5, an input terminal 7 is provided to receive a pulse width modulated signal (a rectangular wave signal) such as is shown on FIGS. 2A and 3A. Such incoming pulse width modulated signal is applied through input terminal 7 to a driving circuit 8 to derive therefrom positive and negative half-cycle signals which are supplied to the gates of P- and N-channel amplifying field effect transistors or FETs $Q_{9a}$ and $Q_{9b}$ to turn these FETs ON and OFF alternatively. The sources of FETs $Q_{9a}$ and $Q_{9b}$ are respectively connected to DC output terminals $T_{21}$ and $T_{22}$ for obtaining therefrom the positive and negative DC voltages of DC power supply 1, and the drains of FETs $Q_{9a}$ and $Q_{9b}$ are connected together to a low pass filter 9 consisting of a coil 10 and a condenser 11. The demodulated output of low pass filter 9, which may be an audio signal, is intended to be supplied to a load L, for example, in the form of a loudspeaker, by way of a signal output terminal 12.

The detecting circuit 6 provided according to this invention for detecting the level of a DC voltage derived from rectifying means 3 of DC power supply 1 is shown to include a series circuit of resistors $R_5$ and $R_6$ connected between terminals $T_{21}$ and $T_{22}$. The junction between resistors $R_5$ and $R_6$ is connected to the base of an NPN-type transistor $Q_4$ and to the emitter of an NPN-type transistor $Q_5$. A resistor $R_7$ is connected between the ground and the base of transistor $Q_4$ to determine detection sensitivity by its resistance value. The emitter of transistor $Q_4$ and the base of transistor $Q_5$ are connected together to ground. The collectors of transistors $Q_4$ and $Q_5$ are connected together to the base of a PNP-type transistor $Q_8$. Between terminal $T_{21}$ and the ground is connected a series circuit of resistors $R_9$ and $R_{10}$ for forming a bias voltage and the junction therebetween is connected through a resistor $R_8$ to the collector of transistor $Q_8$ and to the base of a PNP-type transistor $Q_6$. The emitters of transistors $Q_{16}$ and $Q_8$ are connected together to terminal $T_{21}$. A condenser $C_3$ is connected between the emitter and base of transistor $Q_6$. The collector of transistor $Q_6$ is connected to the base of an NPN-type transistor $Q_7$ and the base of transistor $Q_6$ is connected to the collector of transistor $Q_7$ to form a thryistor configuration.

Further, in accordance with this invention, in the pulse width modulated signal amplifying circuit 5, between low pass filter 9 and signal output terminal 12 is provided a contact 14 of a relay 13 and the emitter of transistor $Q_7$ is connected to ground through a coil 15 of relay 13.

Operation of the pulse width modulated signal amplifier shown on FIG. 1 will now be described with reference to FIGS. 2A to 2D and FIGS. 3A to 3D:

If it is assumed that an unmodulated pulse signal having a duty cycle of 50%, as shown on FIG. 2A, is supplied to input terminal 7 of pulse width modulated signal amplifying circuit 5, a current $I_1$ flows through the source-drain of FET $Q_{9a}$ and has a triangular wave signal with symmetrically positive and negative portions, as shown in FIG. 2B, only during each interval where the pulse signal of FIG. 2A is positive. Similarly, a current $I_2$ flows through the source-drain of FET $Q_{9b}$ and has a triangular wave signal with symmetrically positive and negative portions, as shown on FIG. 2C, only during each interval where the pulse of FIG. 2A is negative. As a result, a triangular wave signal current $I_3$ having symmetrically positive and negative portions, as shown on FIG. 2D, flows through coil 10 of low pass filter 9. Such signal current $I_3$, when integrated by the low pass filter 9, results in zero, so that no signal current flows through load L.

If $l$ is an inductance of coil 10, i is a current flowing through coil 10 and $E_l$ is a voltage across coil 10, the following equation is obtained:

$$l(di/dt) = E_l \quad (1)$$

Accordingly, the current increasing factor is expressed as follows:

$$(di/dt) = (E_l/l) \quad (2)$$

When there is no modulation, $E_l$ becomes equal to the DC power supply voltage $E_1$.

When the input terminal 7 receives a signal which is modulated in pulse width by a positive audio signal, its waveform has a duty cycle other than 50%, as shown on FIG. 3A. Accordingly, the currents $I_1$ and $I_2$ flowing through the source-drains of FETs $Q_{9a}$ and $Q_{9b}$, respectively, are symmetric relative to their positive and negative portions, as shown on FIGS. 3B and 3C, that is each of currents $I_1$ and $I_2$ has a relatively larger positive portion in this example. The current $I_3$ flowing through the coil 10 of low pass filter 9 is also asymmetric, in respect to its positive and negative portions, as shown on FIG. 3D, that is, current $I_3$ becomes a triangular wave current having larger positive portions than negative portions in the case where the signal applied to input terminal 7 is modulated in pulse width by a positive audio signal. As a result, when the triangular wave signal $I_3$ of FIG. 3D is integrated by the low pass filter 9, a DC positive current is supplied to the load L. If $E_o$ is the DC positive voltage across the load L, the following relation is obtained during a positive interval of the pulse signal of FIG. 3A, $$E_l = E_1 - E_o$$

and, during a negative interval of the pulse signal of FIG. 3A, $E_l = -(E_1 + E_o)$.

When the frequency of the pulse width modulated signal supplied to input terminal 7 is very low, for example, on the order of about 20 Hz, and/or when the load impedance is lowered, a large current, in this case a DC positive current, flows through load L. When the pulse signal is modulated by a positive audio signal, the current flowing through the FET $Q_{9a}$ connected to the positive DC output terminal $T_{21}$ is increased in the forward direction, while the current flowing through the FET $Q_{9b}$ connected to the negative DC output terminal $T_{22}$ is increased in the backward direction, as is apparent from FIGS. 3B and 3C, respectively. Consequently, the smoothing condenser $C_{2b}$ associated with the rectifying circuit 3B for producing the negative DC voltage is charged to increase the voltage between terminals $T_{21}$ and $T_{22}$. A similar situation occurs when a negative DC current flows through the load L. In either case, as the absolute value of the positive DC voltage at terminal $T_{21}$ rises or the absolute value of the negative DC voltage at terminal $T_{22}$ rises, such fact is detected by circuit 6, that is, transistor $Q_4$ or $Q_5$ is turned ON to make transistor $Q_8$ conductive. Normally, the electric charge on condenser $C_3$ applies a predetermined voltage between the emitter and base of transistor $Q_6$ to keep it conductive. However, the condenser $C_3$ is short-circuited by the emitter-collector of transistor $Q_8$ when the latter is turned ON so that condenser $C_3$ is discharged and hence transistor $Q_6$ is turned OFF. As a result of the foregoing, transistor $Q_7$, which was in a conductive state, is also turned OFF and hence the coil 15 of relay 13 is de-energized with the result that its contact 14 is opened. The opening of contact 14 prevents the appearance at signal output terminal 12 of the demodulated output signal from low pass filter 9.

Of course, in the normal operating condition of the amplifier, that is, when the DC voltages at terminals $T_{21}$ and $T_{22}$ do not exceed the predetermined value, transistors $Q_4$, $Q_5$ and $Q_8$ are OFF and transistors $Q_6$ and $Q_7$ are ON so that coil 15 of relay 13 is energized to close contact 14 and thereby transmit the demodulated output signal to signal output terminal 12.

It will be noted that, upon turning-on of the power supply 1, condenser $C_3$ and resistor $R_8$ of detecting circuit 6 function as a muting circuit. More particularly, condenser $C_3$ and resistor $R_8$ constitute a time constant circuit to delay the turning ON of transistor $Q_6$, and hence of transistor $Q_7$, until condenser $C_3$ has been charged. Therefore, until such time as condenser $C_3$ is charged following the turning-ON of power supply 1, relay coil 15 remains de-energized to open contact 14 and thereby prevent the transmission of the output signal to terminal 12.

In the above-described embodiment of the invention, when the DC voltage of rectifying circuit 3 applied through constant voltage circuit 4 to terminals $T_{21}$ and $T_{22}$ exceeds a predetermined value and is detected by detecting circuit 6, damage to the smooth condensers $C_{2a}$, $C_{2b}$ or to the amplifying switching devices $Q_{9a}$, $Q_{9b}$ is avoided by opening of contact 14 in response to the detecting circuit 6 to prevent the application of the output signal from amplifying circuit 5 to the load L. However, condensers $C_{2a}$, $C_{2b}$ and amplifying switching devices or FETs $Q_{9a}$ and $Q_{9b}$ may be similarly protected from damage by causing detecting circuit 6, when it detects an excessive DC voltage at terminal $T_{21}$ or $T_{22}$, to suitably lower the DC voltage from rectifying circuit 3, or to disconnect the source of the pulse width modulated signal from input terminal 8 of amplifying circuit 5, or to halt the operation of driving circuit 8.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A pulse width modulated signal amplifier comprising power supply means for providing a DC supply voltage;

amplifying circuit means powered by said power supply means and including input means for receiving a pulse width modulated signal, amplifying switch means having output electrodes and at least one control electrode, said output electrodes being arranged in a series circuit across which said DC supply voltage is applied, driving means connected with said input means for applying to said control electrode a drive signal corresponding to said pulse width modulated signal, an output terminal connected with one of said output electrodes of the amplifying switch means, and low pass filter means interposed between said one output electrode of the amplifying switch means and said output terminal so that said output terminal provides a demodulated output corresponding to said pulse width modulated signal;

detecting means for detecting the voltage level of said DC supply voltage and providing a signal having an operating parameter which depends on the relation of said voltage level of the DC supply voltage to a predetermined value; and protective circuit means operative in response to the signal from said detecting means to inhibit the occurrence of said demodulated output at said output terminal whenever said level of the DC supply voltage exceeds said predetermined value.

2. A pulse width modulated signal amplifier according to claim 1, wherein said power supply means includes a rectifying circuit for rectifying an AC voltage into said DC supply voltage, positive and negative DC output terminals connected to said rectifying circuit and respectively providing positive and negative DC voltages constituting said DC supply voltage, and a pair of smoothing condensors connected between said positive DC output terminal and a reference point and between said negative DC output terminal and said reference point, respectively.

3. A pulse width modulated signal amplifier according to claim 2; wherein said power supply means further includes a pair of voltage regulating circuits between said rectifying circuit and said positive and negative DC output terminals, respectively.

4. A pulse width modulated signal amplifier according to claim 1, wherein said DC supply voltage is constituted by positive and negative DC voltages appearing at positive and negative DC output terminals, respectively, of said power supply means; said amplifying switch means includes a pair of switching devices each having a pair of output electrodes and a control electrode, one output electrode from one of said switching devices being connected with one output electrode from the other of said switching devices to form a junction therebetween and the other output electrodes being each connected to a respective one of said positive and negative DC output terminals so as to form said series circuit between said positive and negative output terminals, said drive signal being applied to the control electrode of each said switching device to drive the latter; and said low pass filter means is connected with said switch means at said junction between said pair of switching devices.

5. A pulse width modulated signal amplifier according to claim 4; wherein said switching devices are field effect transistors each having a gate, source and drain, and gates are connected to said driving means, said sources are connected to said DC output terminals, respectively, and said drains are connected to each other and through said low pass filter means to said signal output terminal.

6. A pulse width modulated signal amplifier according to claim 5; wherein said low pass filter means includes an inductance and a capacitance.

7. A pulse width modulated signal amplifier according to claim 4; wherein said detecting means includes a pair of resistors connected in series between said DC output terminals, and first and second transistors each having a base, collector and emitter, the base of said first transistor and the emitter of said second transistor being connected to a junction between said pair of resistors, the emitter of said first transistor and the base of said second transistor being connected to a reference point, and the collectors of said first and second transistors being connected to each other to provide a detecting signal when either of said positive and negative DC voltages exceeds said predetermined value.

8. A pulse width modulated signal amplifier according to claim 7; wherein said detecting means further includes a resistor between said reference point and the junction of said pair of resistors.

9. A pulse width modulated signal amplifier according to claim 1; wherein said protective circuit means includes energizing means controlled by said detecting means for producing an energizing signal in the absence of said detecting signal, and protective switching means interposed between said low pass filter means and said signal output terminal for applying the demodulated output signal to said signal output terminal only when said protective switching means is closed by said energizing signal.

10. A pulse width modulated signal amplifier according to claim 9; wherein said energizing means includes third, fourth and fifth transistors each having a base, collector and emitter, and bias means, the emitters of said third and fourth transistors being connected to each other and to a DC voltage source, the collectors of said third and fifth transistors and the base of said fourth transistors being connected to each other and to said bias means, the collector of said fourth transistor and the base of said fifth transistor being connected to each other, the base of said third transistor being supplied with said detecting signal, and the emitter of said fifth transistor being connected to said protective switching means for applying said energizing signal to the latter.

11. A pulse width modulated signal amplifier according to claim 10; wherein said energizing means further includes a condenser connected between the emitter and the collector of said third transistor.

12. A pulse width modulated signal amplifier comprising:
DC power supply means including a pair of AC input terminals for receiving an AC voltage, rectifying circuit means connected to said pair of AC input terminals to produce positive and negative DC voltages, and a pair of DC output terminals respectively supplied with said positive and negative DC voltages;
a pulse width modulated signal amplifying circuit including an input terminal for receiving a pulse width modulated signal, a signal output terminal, a driving circuit connected to said input terminal to provide a drive signal in response to said pulse width modulated signal a pair of switching devices, each having two output electrodes and a control electrode, one of said output electrodes of one of said switching devices and one of said output electrodes of the other of said switching devices being connected together to form a junction between said pair of switching devices and the other output electrodes of said switching devices being connected, respectively, to said DC output terminals so as to form a series circuit between said pair of DC output terminals, said drive signal being applied to the control electrode of each said switching device to drive the latter, and a low pass filter connected between said junction of said pair of switching devices and said signal output terminal; and
a detecting circuit connected to said DC output terminals and to a reference point for detecting the levels of said positive and negative DC voltages and providing a detecting signal when either of said levels exceeds a predetermined value.

13. A pulse width modulated signal amplifier according to claim 12; wherein said DC power supply means further includes a pair of smoothing condensers connected between one said DC output terminals and said reference point and between the other of said DC output terminals and said reference point, respectively.

14. A pulse width modulated signal amplifier according to claim 13; wherein said DC power supply means further includes a pair of voltage regulating circuits between said rectifying circuit means and said DC output terminals, respectively.

15. A pulse width modulated signal amplifier according to claim 12; wherein said switching devices are composed of field effect transistors each having a gate, source and drain, said gates being connected to said driving circuit, said sources being connected to said DC output terminals, respectively, and said drains being connected to each other and through said low pass filter to said signal output terminal.

16. A pulse width modulated signal amplifier according to claim 15; wherein said low pass filter includes an inductance and a capacitance.

17. A pulse width modulated signal amplifier according to claim 12; wherein said detecting circuit includes a pair of resistors connected in series between said DC output terminals, and first and second transistors each having a base, collector and emitter, the base of said first transistor and the emitter of said second transistor being connected to the junction of said pair of resistors, the emitter of said first transistor and the base of said second transistor being connected to said reference point, and the collectors of said first and second transistors being connected to each other to provide said detecting signal.

18. A pulse width modulated signal amplifier according to claim 17; wherein said detecting circuit further includes a resistor between said reference point and the junction of said pair of resistors.

* * * * *